US007183197B2

(12) United States Patent
Won et al.

(10) Patent No.: US 7,183,197 B2
(45) Date of Patent: Feb. 27, 2007

(54) WATER-BARRIER PERFORMANCE OF AN ENCAPSULATING FILM

(75) Inventors: Tae Kyung Won, San Jose, CA (US); Sanjay Yadav, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/133,130

(22) Filed: May 18, 2005

(65) Prior Publication Data

US 2005/0287688 A1 Dec. 29, 2005

Related U.S. Application Data

(63) Continuation-in-part of application No. 10/876,440, filed on Jun. 25, 2004.

(51) Int. Cl.
*H01L 21/4763* (2006.01)

(52) U.S. Cl. ............. 438/622; 438/474; 438/475; 257/E21; 257/278; 257/292; 257/319

(58) Field of Classification Search ............ 438/622, 438/22, 30, 618, 623, 474, 475, 724, 744, 438/757, 791
See application file for complete search history.

(56) References Cited

U.S. PATENT DOCUMENTS 5,399,387 A    3/1995   Law et al.

(Continued)

FOREIGN PATENT DOCUMENTS

| EP | 1 365 389 A | 11/2003 |
| JP | 61218135 | 9/1986 |
| JP | 2003197636 | 7/2003 |
| WO | WO 00/15869 A | 3/2000 |

OTHER PUBLICATIONS

Nakayama et al., "Physical Properties of diamondlike carbon films deposited in mixed atmospheres of $C_2H_4$—Ar, $C_2H_4$—$H_2$ and $C_2H_4$—$N_2$", *J. Vac. Sci. Technol.* (1996) 2418-2426.

(Continued)

*Primary Examiner*—David Nhu
(74) *Attorney, Agent, or Firm*—Patterson & Sheridan LLP

(57) ABSTRACT

A method and apparatus for depositing a material layer onto a substrate is described. The method includes delivering a mixture of precursors for the material layer into a process chamber and depositing the material layer on the substrate at low temperature. The material layer can be used as an encapsulating layer for various display applications which require low temperature deposition process due to thermal instability of underlying materials used. In one aspect, the encapsulating layer includes one or more material layers (multilayer) having one or more barrier layer materials and one or more low-dielectric constant materials. The encapsulating layer thus deposited provides reduced surface roughness, improved water-barrier performance, reduce thermal stress, good step coverage, and can be applied to many substrate types and many substrate sizes. Accordingly, the encapsulating layer thus deposited provides good device lifetime for various display devices, such as OLED devices. In another aspect, a method of depositing an amorphous carbon material on a substrate at low temperature is provided. The amorphous carbon material can be used to reduce thermal stress and prevent the deposited thin film from peeling off the substrate.

35 Claims, 9 Drawing Sheets

U.S. PATENT DOCUMENTS

| | | | |
|---|---|---|---|
| 5,438,222 | A | 8/1995 | Yamazaki et al. |
| 5,593,741 | A | 1/1997 | Ikeda et al. |
| 5,733,610 | A | 3/1998 | Okazaki et al. |
| 6,055,927 | A | 5/2000 | Shang et al. |
| 6,337,102 | B1 | 1/2002 | Forrest et al. |
| 6,506,691 | B2 | 1/2003 | Cook et al. |
| 6,645,884 | B1 | 11/2003 | Yang |
| 6,699,739 | B2 | 3/2004 | Yamazaki et al. |
| 6,710,542 | B2 | 3/2004 | Chun et al. |
| 6,770,562 | B2 | 8/2004 | Yamazaki et al. |
| 6,791,129 | B2 | 9/2004 | Inukai |
| 6,991,859 | B2 * | 1/2006 | Klubek et al. .............. 428/690 |
| 7,074,640 | B2 * | 7/2006 | Maloney et al. .............. 438/82 |
| 2003/0159656 | A1 | 8/2003 | Zhengqouan et al. |
| 2004/0113542 | A1 | 6/2004 | Hsaio et al. |
| 2004/0262613 | A1 | 12/2004 | Maekawa et al. |
| 2006/0158101 | A1 * | 7/2006 | Camilletti et al. .......... 313/504 |

OTHER PUBLICATIONS

Ronald M. Kubacki, "Low Temperature Plasma Deposition of Silicon Nitride to Produce Ultra-Reliable, High Performance, Low Cost Sealed Chip-on-Board (SCOB) Assemblies", IEEE/CPMT Intl Electronics Manufacturing Technology Symposium 1994, pp. 273-280.

Yoshimi et al., "Amorphous Carbon Basis Blue Light Electroluminescent Device", *Optoelectronics Devices and Technologies, Mita Press*, vol. 7, Nos. 1 Jun. 1992, pp. 69-81.

International Search Report dated Dec. 20, 2005 for corresponding PCT application, PCT/US2005/020079.

Huang et al., "Low Temperature PECBD SiN, Films Applied in OLED Packaging", *Materials Science and Engineering B98* (2003) 248-254.

Kathleen M. Vaeth, "OLED-Display Technology". *Information Display*, Jun. 2003, pp. 12-17.

Tao Feng et al., "Silicon Nitride Thin Films Packaging for Flexible Organic Light Emitting Devices", *International Journal of Modern Physics B*, vol. 16, Nos. 6 & 7 (2002) pp. 1052-1056.

P.E. Burrows et al., "Gas Permeation and Lifetime Tests on Polymer-Based Barrier Coatings" *SPIE Annual Meeting, Invited Paper*, Aug. 30, 2000, pp. 1-9.

* cited by examiner

WATER-BARRIER PERFORMANCE OF AN ENCAPSULATING FILM

CROSS-REFERENCE TO RELATED APPLICATIONS

This application is a continuation-in-part of co-pending U.S. patent application Ser. No. 10/876,440, titled "Method to improve water-barrier performance by changing film surface morphology" (AMAT/8838), filed Jun. 25, 2004. The aforementioned related patent application is herein incorporated by reference.

BACKGROUND OF THE INVENTION

1. Field of the Invention

Embodiments of the present invention generally relate to the deposition of thin films using chemical vapor deposition processing. More particularly, this invention relates to a process for depositing thin films onto large area substrates.

2. Description of the Related Art

Organic light emitting diode (OLED) displays have gained significant interest recently in display applications in view of their faster response times, larger viewing angles, higher contrast, lighter weight, lower power and amenability to flexible substrates, as compared to liquid crystal displays (LCD). After efficient electroluminescence (EL) was reported by C. W. Tang and S. A. Van Slyke in 1987, practical application of OLED is enabled by using two layers of organic materials sandwiched between two electrodes for emitting light. The two organic layers, in contrast to the old single organic layer, include one layer capable of monopolar (hole) transport and the other layer for electroluminescence and thus lower the required operating voltage for OLED display.

In addition to organic materials used in OLED, many polymer materials are also developed for small molecule, flexible organic light emitting diode (FOLED) and polymer light emitting diode (PLED) displays. Many of these organic and polymer materials are flexible for the fabrication of complex, multi-layer devices on a range of substrates, making them ideal for various transparent multi-color display applications, such as thin flat panel display (FPD), electrically pumped organic laser, and organic optical amplifier.

Over the years, layers in display devices have evolved into multiple layers with each layer serving different function. FIG. 1 shows an example of an OLED device structure built on a substrate 101. After a transparent anode layer 102, such as an indium tin oxide (ITO) layer, is deposited on the substrate 101, a stack of organic layers are deposited on the anode layer 102. The organic layers could comprise a hole-injection layer 103, a hole-transport layer 104, an emissive layer 105, an electron-transport layer 106 and an electron injection layer 107. It should be noted that not all five layers of organic layers are needed to build an OLED cell. For example, in some cases, only a hole-transport layer 104 and an emissive layer 105 are needed. Following the organic layer deposition, a metallic cathode 108 is deposited on top of the stack of organic layers. When an appropriate voltage 110 (typically a few volts) is applied to the cell, the injected positive and negative charges recombine in the emissive layer to produce light 120 (electroluminescence). The structure of the organic layers and the choice of anode and cathode are designed to maximize the recombination process in the emissive layer, thus maximizing the light output from the OLED devices.

The lifetime of display devices can be limited, characterized by a decrease in EL efficiency and an increase in drive voltage, due to the degradation of organic or polymer materials, the formation of non-emissive dark spots, and crystallization of the organic layers at high temperature of about 55° C. or higher, e.g., crystallization of the hole transport materials can occur at room temperature. Therefore, a low temperature deposition process for these materials, such as at about 100° C. or lower is needed. In addition, the main reason for the material degradation and dark spot problems is moisture and oxygen ingress. For example, exposure to humid atmospheres is found to induce the formation of crystalline structures of 8-hydroxyquinoline aluminum ($Alq_3$), which is often used as the emissive layer, resulting in cathode delamination, and hence, creating non-emissive dark spots growing larger in time. In addition, exposure to air or oxygen may cause cathode oxidation and once organic material reacts with water or oxygen, the organic material is dead.

Currently, most display manufacturers use metal-can or glass-can materials as an encapsulation layer to protect organic materials in the device from water ($H_2O$) or oxygen ($O_2$) attack. FIG. 2 illustrates the conventional packaging of an OLED device 200 on a substrate 201 with glass or metal encapsulating materials 205. The device 200 includes an anode layer 202 and a cathode layer 204 with multiple layers of organic materials 203. The metal or glass materials 205 are attached to the substrate 201 like a lid using a bead of UV-cured epoxy 206. However, moisture can easily penetrate through the epoxy 206 and damage the device 200.

Other materials, such as inorganic materials, e.g., silicon nitride (SiN), silicon oxynitride (SiON) and silicon oxide (SiO), prepared by plasma enhanced chemical vapor deposition (PECVD), can also be used as an effective encapsulation/barrier layer against moisture, air and corrosive ions for such devices. However, it is very difficult to generate water-barrier inorganic encapsulation materials using a low temperature deposition process because the resulting film is less dense and has high defect pinhole structures. It is important to note that the presence of residual moisture in the organic layers may also promote the $Alq_3$ crystallization process even in encapsulated devices. In addition, oxygen and humidity being trapped during encapsulation and infiltrating into the OLED device to be in contact with the cathode and organic materials generally result in dark spot formation, which is a frequent OLED destroying defect. Therefore, a good encapsulation/barrier film also requires low water vapor transmission rate (WVTR).

Additional problems with thin film inorganic silicon nitride (SiN) related materials as the encapsulation/barrier layer arise. If the encapsulating layer is thick to serve as a good oxygen and water barrier, it is usually hard, fragile, and too thick to adhere well to a substrate surface, resulting in cracking or peeling off the substrate surface, especially at high temperature and humidity stressed conditions. If the encapsulating layer is made thin to improve adhesion and thermal stability, it is not thick enough as a moisture barrier. Therefore, additional layers or other manipulation may be required.

Thus, there is still a need for methods of depositing low temperature encapsulation/barrier films onto large area substrates with improved water-barrier and thermal stress performance to protect the devices underneath.

SUMMARY OF THE INVENTION

Embodiments of the invention generally provide a method and apparatus for depositing an encapsulating film onto a substrate. In one embodiment, a method for forming a multilayer encapsulating film onto a substrate placed in a substrate processing system includes depositing one or more silicon-containing inorganic barrier layers onto the surface of the substrate at a substrate temperature of about 200° C. or lower, and depositing one or more low-dielectric constant material layers alternating with the one or more silicon-containing inorganic barrier layers. The one or more silicon-containing inorganic barrier layers are deposited by delivering a first mixture of precursors and a hydrogen gas into the substrate processing system to improve water-barrier performance of the encapsulating layer. The one or more low-dielectric constant material layers are deposited by delivering a second mixture of precursors into the substrate processing system.

In another embodiment, a method of forming a multilayer encapsulating film onto a substrate placed in a substrate processing system, includes depositing a plurality of silicon-containing inorganic barrier layers onto the surface of the substrate by delivering a silicon-containing compound into the substrate processing system, and depositing one or more low-dielectric constant material layers in between the one or more silicon-containing inorganic barrier layers at a substrate temperature of about 200° C. or lower by delivering a carbon-containing compound and a hydrogen gas into the substrate processing system. Accordingly, the multilayer encapsulating film having the plurality of silicon-containing inorganic barrier layers and the one or more low-dielectric constant material layers is generated on the surface of the substrate.

In yet another embodiment, a method for depositing a low-dielectric constant material layer onto a substrate at low temperature is provided. The method includes placing the substrate in a process chamber, generating a plasma inside the process chamber, depositing the low-dielectric constant material layer onto the substrate at a substrate temperature of about 200° C. or lower from a mixture of a carbon-containing compound and a hydrogen gas into the process chamber. Accordingly, the film uniformity of the deposited low-dielectric constant material layer is improved to about +/−10% or less.

In still another embodiment, a method for depositing an encapsulating layer, having one or more layers of silicon-containing inorganic barrier materials and low-dielectric constant materials, onto a substrate is provided. The method includes delivering a first mixture of precursors for a silicon-containing inorganic barrier layer into the substrate processing system and delivering a hydrogen gas into the substrate processing system, and controlling the temperature of the substrate to a temperature of about 150° C. or lower and generating a plasma to deposit the silicon-containing inorganic barrier layer on the surface of the substrate. The method further includes delivering a second mixture of precursors for a low-dielectric constant material layer into the substrate processing system and delivering a hydrogen gas into the substrate processing system, and controlling the temperature of the substrate to a temperature of about 150° C. or lower and generating a plasma to deposit the low-dielectric constant material layer onto the surface of the silicon-containing inorganic barrier layer. The method further includes depositing the encapsulating layer onto the substrate by repeating the above mentioned steps until a thickness of the encapsulating layer of about 15,000 angstroms or more is obtained.

In still another embodiment, an apparatus to deposit a low temperature material layer onto a substrate is also provided. The apparatus includes, a substrate support disposed in a process chamber to support a substrate, such as a large area substrate, a RF source coupled to the process chamber to provide a plasma inside the process chamber, a silicon-containing compound supply source coupled to the process chamber, a hydrogen gas supply source coupled to the process chamber, a carbon-containing compound supply source coupled to the process chamber, and a controller coupled to the process chamber to control the temperature of the substrate to about 200° C. or lower during substrate processing and adapted to deposit an encapsulating layer having one or more low-dielectric constant material layers in between one or more silicon-containing inorganic barrier layers.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
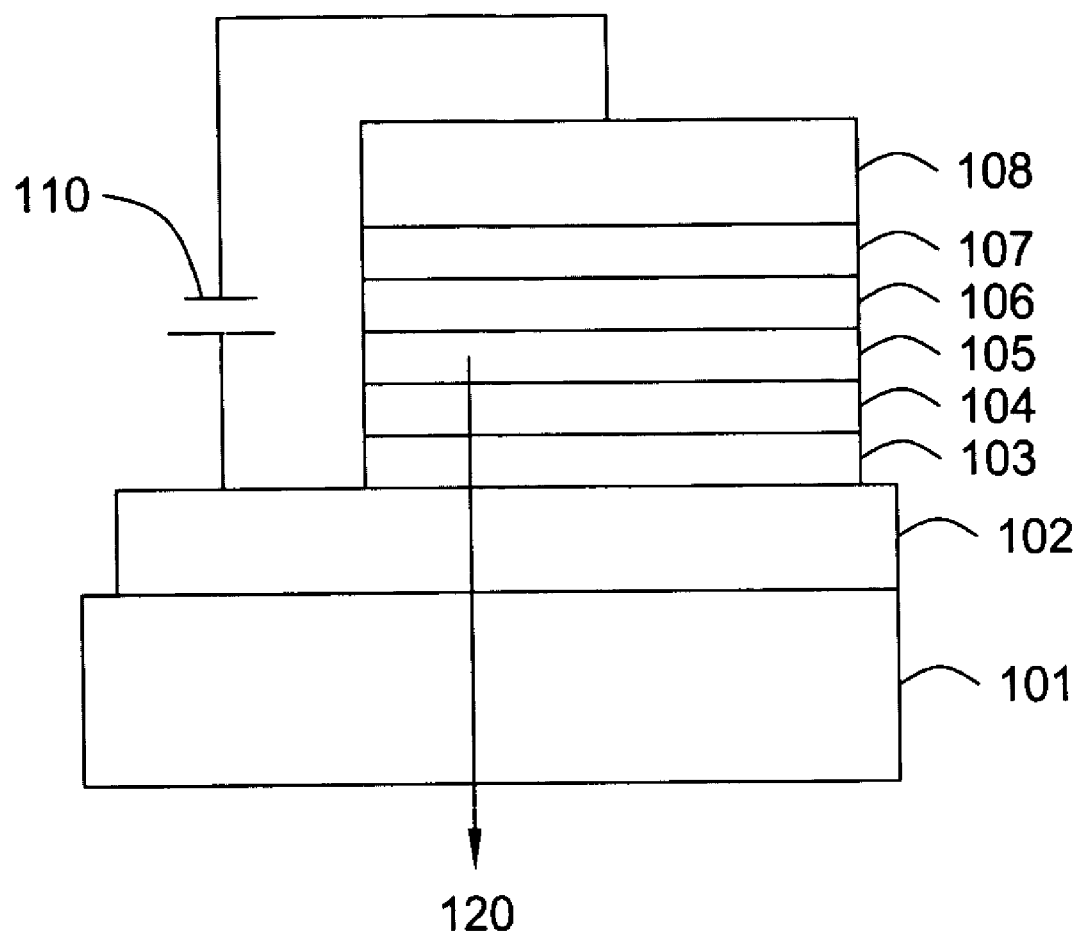
FIG. 1 depicts a cross-sectional schematic view of an OLED device.
Figure 2:
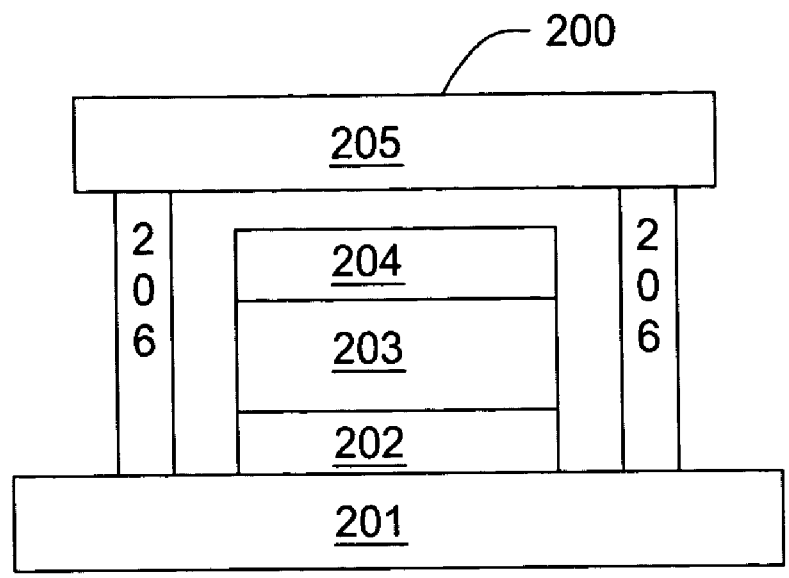
FIG. 2 depicts a cross-sectional schematic view of an OLED device with an encapsulating material (glass or metal) attached on top.

The present invention generally relates to a method of improving water-barrier and thermal stability performance between a substrate and a film/layer deposited thereon. The invention describes using a hydrogen gas to reduce film surface roughness, resulting in a smooth film surface. Accordingly, high level of uniformity of a film deposited on a substrate surface can be obtained. The smooth surface of the deposited film further prevents water and oxygen penetrating from atmosphere into the film and shows much lower WVTR (Water Vapor Transmission Rate) value. WVTR is a key parameter to indicate water-barrier performance in the Flat Panel Display (FPD) industry. Further, the invention provides a method and apparatus to deposit an encapsulating/barrier layer on the surface of a substrate, such as a display device, to greatly enhance/lengthen the lifetime of the device.

In addition, the invention describes a method of depositing a low-dielectric constant material layer at a low temperature, such as about 200° C. or lower, onto a large area substrate surface. The low-dielectric constant material layer can be an amorphous carbon material, a diamond-like-carbon material, carbon-doped silicon containing material, among others. The low-dielectric constant material and/or amorphous carbon material can be used as portions of an encapsulating layer to improve film uniformity, film adhesion, and thermal stability of the encapsulating layer. Accordingly, one or more layers of low-dielectric constant materials or amorphous carbon materials can be deposited on a substrate surface to function as adhesion enhancing layers or thermal stress relaxation layers to improve water performance of display devices, such as OLED devices, among others.

The invention further provides a single-layer or multilayer encapsulating film that can be used to prevent water and oxygen from diffusing onto a surface of substrate. The single-layer encapsulating film may be a silicon-containing inorganic barrier material, such as silicon nitride, silicon oxynitride, silicon oxide, silicon carbide, among others. The multilayer encapsulating film may include one or more barrier layers and one or more low-dielectric constant material layers. The one or more low-dielectric constant material layers are functioned to enhance adhesion and thermal stability of the encapsulating layer and/or the one or more barrier layers.

In one embodiment, the one or more low-dielectric constant material layers are deposited in between the one or more barrier layers. For example, alternating layers of at least one low-dielectric constant material layer and at least one barrier layer are deposited on a surface of a substrate, such as a display device.

In another embodiment, a first barrier layer is deposited onto a surface of a substrate to provide good water-barrier performance before a first low-dielectric constant material layer. In still another embodiment, a multilayer encapsulating film is deposited on top of a substrate surface such that a final layer of a silicon-containing inorganic barrier material is deposited to provide good water-barrier performance of the multilayer encapsulating film.

Substrates of the invention can be circular or polygonal for semiconductor wafer manufacturing and flat panel display manufacturing. The surface area of a rectangular substrate for flat panel display is typically large, for example, a rectangle of about 500 mm$^2$ or larger, such as at least about 300 mm by about 400 mm, e.g., about 120,000 mm$^2$ or larger. In addition, the invention applies to any devices, such as OLED, FOLED, PLED, organic TFT, active matrix, passive matrix, top emission device, bottom emission device, solar cell, etc., and can be on any of the silicon wafers, glass substrates, metal substrates, plastic films (e.g., polyethylene terephthalate (PET), polyethylene naphthalate (PEN), etc.), plastic epoxy films, among others.

Figure 3:
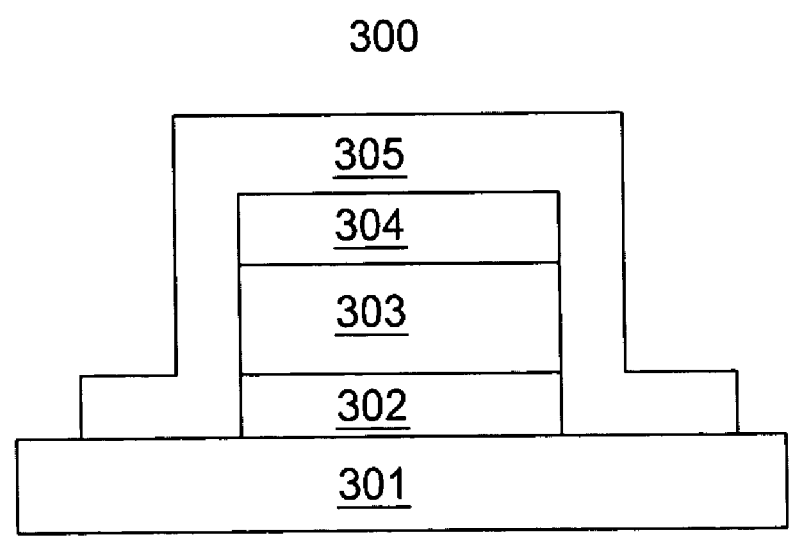
FIG. 3 depicts a cross-sectional schematic view of an OLED device with an encapsulating layer deposited on top in accordance with one embodiment of the invention.

FIG. 3 shows an exemplary embodiment of an encapsulating layer 305 deposited on a substrate 301 of a display device 300 using methods of the invention. For example, a transparent anode layer 302 is deposited on the substrate 301, which could be made of glass or plastic, such as polyethyleneterephthalate (PET) or polyethyleneterephthalate (PEN). An example of the transparent anode layer 302 is an indium-tin-oxide (ITO) with the thickness in the range of about 200 Å to about 2000 Å.

Multiple layers of organic or polymer materials 303 can be deposited on top of the anode layer 302. For example, a material layer 303 can include a hole-transport layer deposited on top of the anode layer. Examples of the hole-transport layer include: diamine, such as a naphthyl-substituted benzidine (NPB) derivative, or N,N'-diphenyl-N,N'-bis(3-methylphenyl)-(1,1'-biphenyl)-4,4'-diamine (TPD), for a thickness of about 200 Å to about 1000 Å. Following the hole-transport layer deposition, an emissive layer can be deposited. Materials for the emissive layer typically belong to a class of fluorescent metal chelated complexes. An example is 8-hydroxyquinoline aluminum ($Alq_3$). The thickness of the emissive layer is typically in the range of about 200 Å to about 1500 Å. After the emissive layer is deposited, these organic layers are patterned. OLED displays are typically deposited on a pre-patterned surface of the substrate by ink-jet printing or evaporation method. After patterning of the organic materials 303, a top electrode layer 304, such as a cathode layer, is then deposited and patterned. The top electrode layer 304 can be a metal, a mixture of metals or an alloy of metals. An example of the top electrode material is an alloy of magnesium (Mg), silver (Ag) and aluminum (Al) in the thickness range of about 1000 Å to about 3000 Å.

The encapsulating layer 305 is deposited on top of the substrate surface after construction of the display device 300, such as an OLED device, is complete. Exemplary materials of the encapsulating layer 305 of the invention include a thin layer of inorganic nitride film, inorganic oxide film, and polymer-type organic film deposited in the thickness range of about 500 Å to about 500,000 Å, such as between about 2,000 Å to about 50,000 Å. For example, silicon nitride (SiN), silicon oxynitride (SiON), silicon oxide (SiO), and silicon carbide (SiC), among others, can be used as the encapsulating material.

One embodiment of the invention provides that the encapsulating layer 305 deposited on a substrate 301 includes one or more layers of barrier/encapsulating materials, such as inorganic nitride, inorganic oxide film and polymer-type organic material. In addition, the invention further provides using one or more additional material layers, such as various carbon-containing materials and polymer-type organic materials, and low-dielectric constant materials, e.g., amorphous carbon, diamond-like-carbon, carbon-doped silicon containing material, etc., in the encapsulating layer 305 to enhance adhesion and soften the encapsulating layer 305.

Substrate Processing System

The invention is illustratively described below in reference to a plasma enhanced chemical vapor deposition system configured to process large area substrates, such as various parallel-plate radio-frequency (RF) plasma enhanced chemical vapor deposition (PECVD) systems including AKT® 1600, AKT® 3500, AKT® 4300, AKT® 5500, AKT® 10K, AKT® 15K, and AKT® 25K for various substrate sizes, available from AKT®, a division of Applied Materials, Inc., Santa Clara, Calif. However, it should be understood that the invention has utility in other system configurations, such as other chemical vapor deposition systems and any other film deposition systems, including those systems configured to process round substrates.

The invention provides a substrate processing system having one or more process chambers in order to deposit a single-layer or multilayer encapsulating film on a substrate surface. The multilayer encapsulating film of the invention can be deposited in the same or different substrate processing system, in the same or different process chambers of a substrate processing system. In one embodiment, the multilayer encapsulating film is deposited in the same vacuum substrate processing system to save time and improve processing throughput. In another embodiment, the multilayer encapsulating film of the invention can be deposited on a substrate surface in the same or different process chambers inside a multi-chambered substrate processing system. For example, the multilayer encapsulating film having one or more silicon-containing inorganic barrier layers and one or more low-dielectric constant material layers can be efficiently deposited in a chemical vapor deposition (CVD) system without taking the substrate out of the CVD system and decrease the possibility of water and oxygen to diffuse onto the substrate surface.

Figure 4:
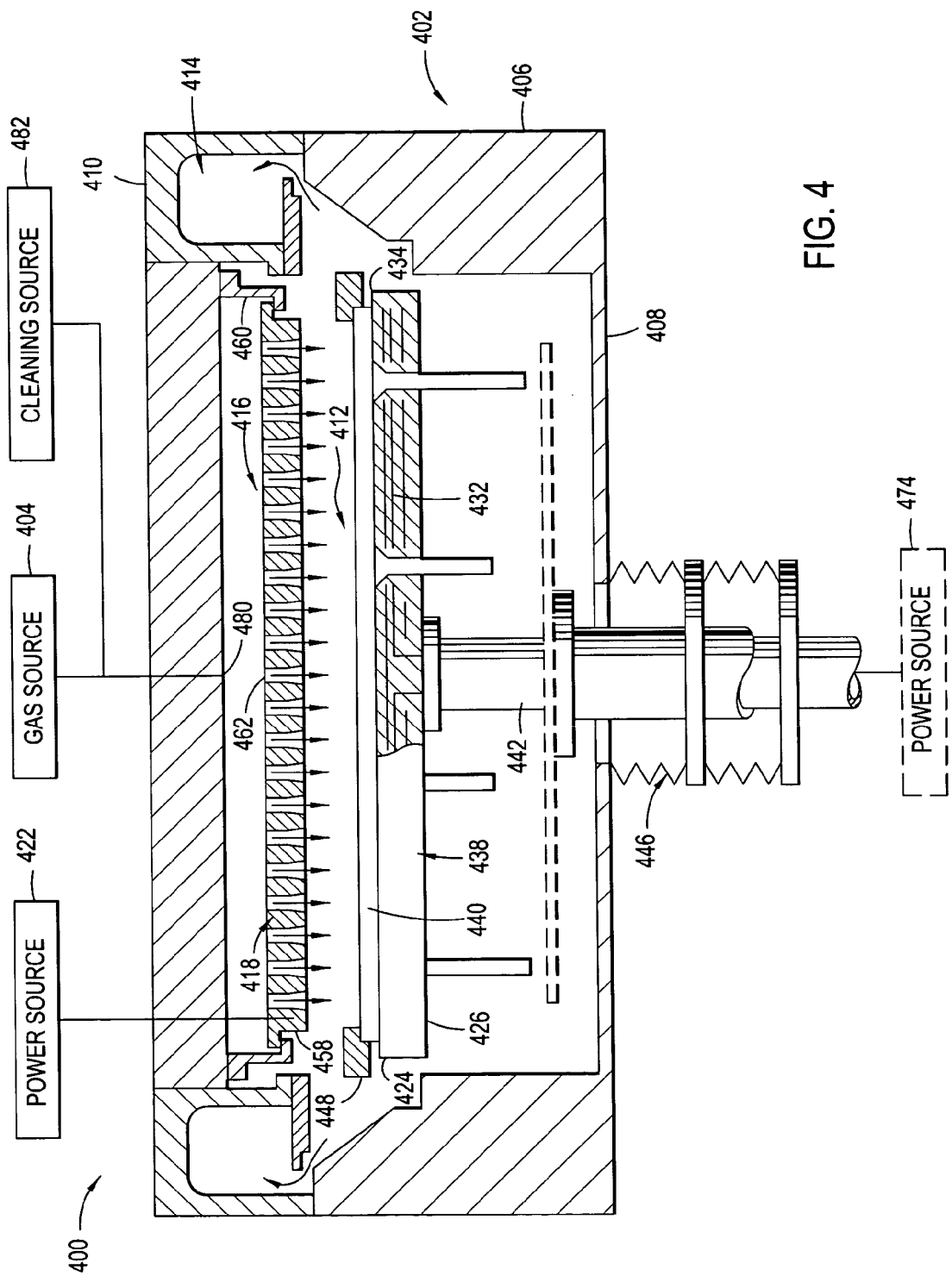
FIG. 4 is a schematic cross-sectional view of one embodiment of a process chamber in accordance with the invention.

FIG. 4 is a schematic cross-sectional view of one embodiment of a substrate processing system 400 having one or more plasma enhanced chemical vapor deposition chambers, available from AKT®, a division of Applied Materials, Inc., Santa Clara, Calif. The substrate processing system 400 generally includes one or more processing chambers 402, substrate input/output chambers, a main transfer robot for transferring substrate among the substrate input/output chambers and the processing chambers 402, and a mainframe controller for automatic substrate processing control.

The processing chamber 402 is usually coupled to one or more supply sources 404 for delivery one or more source compounds and/or precursors. The one or more supply sources 404 may include a silicon-containing compound supply source, a hydrogen gas supply source, a carbon-containing compound supply source, among others. The processing chamber 402 has walls 406 and a bottom 408 that partially define a process volume 412. The process volume 412 is typically accessed through a port and a valve (not shown) to facilitate movement of a substrate 440, such as a large area glass substrate, into and out of the processing chamber 402. The walls 406 support a lid assembly 410 that contains a pumping plenum 414 that couples the process volume 412 to an exhaust port (that includes various pumping components, not shown) for exhausting any gases and process by-products out of the processing chamber 402.

A temperature controlled substrate support assembly 438 is centrally disposed within the processing chamber 402. The substrate support assembly 438 supports the substrate 440 during processing. The substrate support assembly 438 comprises an aluminum body 424 that encapsulates at least one embedded heater 432. The heater 432, such as a resistive element, disposed in the substrate support assembly 438, is coupled to an optional power source 474 and controllably heats the support assembly 438 and the substrate 440 positioned thereon to a predetermined temperature.

In one embodiment, the temperature of the heater 432 can be set at about 200° C. or lower, such as 150° C. or lower, or between about 20° C. to about 100° C., depending on the deposition/processing parameters for a material layer being deposited. For example, the heater can be set at between about 60° C. to about 80° C., such as at about 70° C., for a low temperature deposition process.

In another embodiment, a port having hot water flowing therein is disposed in the substrate support assembly 438 to maintain the substrate 440 at a uniform temperature of 200° C. or lower, such as between about 20° C. to about 100° C. Alternatively, the heater 432 can be turned off with only hot water flowing inside the substrate support assembly 438 to control the temperature of the substrate during deposition, resulting in a substrate temperature of about 100° C. or lower for a low temperature deposition process.

The support assembly 438 generally is grounded such that RF power supplied by a power source 422 to a gas distribution plate assembly 418 positioned between the lid assembly 410 and substrate support assembly 438 (or other electrode positioned within or near the lid assembly of the chamber) may excite gases present in the process volume 412 between the support assembly 438 and the gas distribution plate assembly 418. The RF power from the power source 422 is generally selected commensurate with the size of the substrate to drive the chemical vapor deposition process.

In one embodiment, a RF power of about 10 W or larger, such as between about 400 W to about 5000 W, is applied to the power source 422 to generate an electric field in the process volume 412. For example, a power density of about 0.2 watts/cm2 or larger, such as between about 0.2 watts/cm$^2$ to about 0.8 watt/cm$^2$, or about 0.45 watts/cm$^2$, can be used to be compatible with a low temperature substrate deposition method of the invention. The power source 422 and matching network (not shown) create and sustain a plasma of the process gases from the precursor gases in the process volume 412. Preferably high frequency RF power of 13.56 MHz can be used, but this is not critical and lower frequencies can also be used. Further, the walls of the chamber can be protected by covering with a ceramic material or anodized aluminum material.

Generally, the support assembly 438 has a lower side 426 and an upper side 434, supporting the substrate 440. The lower side 426 has a stem 442 coupled thereto and connected to a lift system (not shown) for moving the support assembly 438 between an elevated processing position (as shown) and a lowered substrate transfer position. The stem 442 additionally provides a conduit for electrical and thermocouple leads between the support assembly 438 and other components of the system 400. A bellows 446 is coupled to the substrate support assembly 438 to provide a vacuum seal between the process volume 412 and the atmosphere outside the processing chamber 402 and facilitate vertical movement of the support assembly 438.

In one embodiment, the lift system is adjusted such that a spacing between the substrate and the gas distribution plate assembly 418 is about 400 mils or larger, such as between about 400 mils to about 1600 mils, e.g., about 900 mils, during processing. The ability to adjust the spacing enables the process to be optimized over a wide range of deposition conditions, while maintaining the required film uniformity over the area of a large substrate. The combination of a grounded substrate support assembly, a ceramic liner, high pressures and close spacing gives a high degree of plasma confinement between the gas distribution plate assembly 418 and the substrate support assembly 438, thereby increasing the concentration of reactive species and the deposition rate of the subject thin films.

The support assembly 438 additionally supports a circumscribing shadow frame 448. Generally, the shadow frame 448 prevents deposition at the edge of the substrate 440 and support assembly 438 so that the substrate does not stick to the support assembly 438. The lid assembly 410 typically includes an entry port 480 through which process gases provided by the gas source 404 are introduced into the processing chamber 402. The entry port 480 is also coupled to a cleaning source 482. The cleaning source 482 typically provides a cleaning agent, such as disassociated fluorine, that is introduced into the processing chamber 402 to remove deposition by-products and films from processing chamber hardware, including the gas distribution plate assembly 418.

The gas distribution plate assembly 418 is typically configured to substantially follow the profile of the substrate 440, for example, polygonal for large area substrates and circular for wafers. The gas distribution plate assembly 418 includes a perforated area 416 through which precursors and other gases, such as hydrogen gas, supplied from the gas source 404 are delivered to the process volume 412. The perforated area 416 is configured to provide uniform distribution of gases passing through the gas distribution plate assembly 418 into the processing chamber 402. The gas distribution plate assembly 418 typically includes a diffuser plate 458 suspended from a hanger plate 460. A plurality of gas passages 462 are formed through the diffuser plate 458 to allow a predetermined distribution of gas passing through the gas distribution plate assembly 418 and into the process volume 412.

Gas distribution plates that may be adapted to benefit from the invention are described in commonly assigned U.S. patent application Ser. No. 09/922,219, filed Aug. 8, 2001 by Keller et al.; Ser. No. 10/140,324, filed May 6, 2002; and Ser. No. 10/337,483, filed Jan. 7, 2003 by Blonigan et al.; U.S. Pat. No. 6,477,980, issued Nov. 12, 2002 to White et al.; and U.S. patent application Ser. No. 10/417,592, filed Apr. 16, 2003 by Choi et al., which are hereby incorporated by reference in their entireties. Although the invention has been described in accordance with certain embodiments and examples, the invention is not meant to be limited thereto. The CVD process herein can be carried out using other CVD chambers, adjusting the gas flow rates, pressure, plasma density, and temperature so as to obtain high quality films at practical deposition rates.

Deposition of an Encapsulating Film

Figure 5:
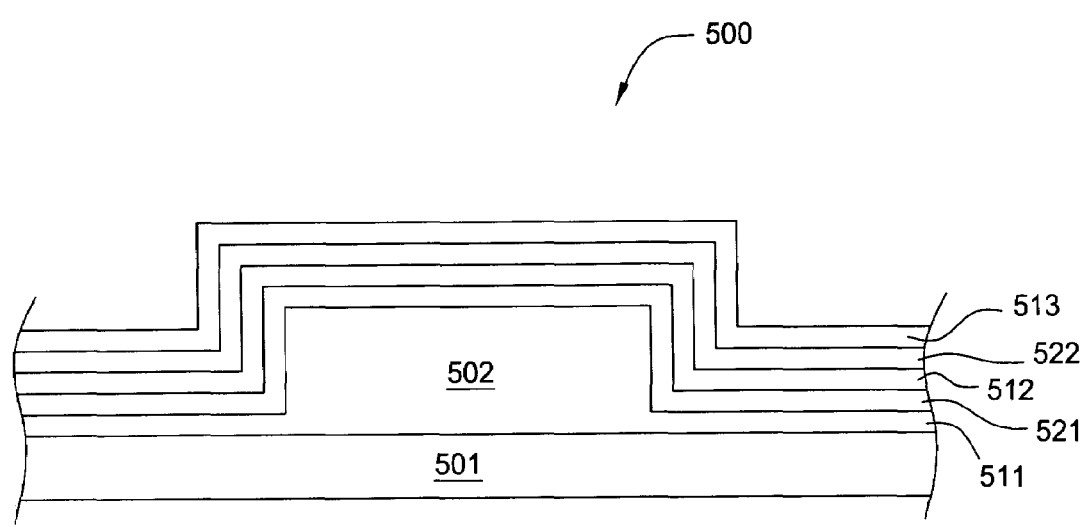
FIG. 5 depicts a cross-sectional schematic view of one embodiment of an encapsulating layer deposited in accordance with one method of the invention.

FIG. 5 shows an exemplary display device 500 fabricated using methods of the invention according to embodiments of the invention. The display device 500 may include a substrate 501 and a device 502, which may be any type of display devices which need to be encapsulated. For example, the device 502 can be OLED, FOLED, PLED, organic TFT, solar cell, top emissive device, bottom emissive device, among others. An encapsulating layer having a thickness of about 1,000 Å or larger is then deposited using methods of the invention to prevent water/moisture and air to penetrate into the substrate 501 and the device 502.

In one embodiment, a multilayer encapsulating film having at least one barrier layer and at least one low-dielectric constant material layer is deposited on top of the device 502 to prevent water and other gases or liquids from diffusing into the device 502 and short-circuit the device 502 without the multilayer encapsulating film being cracked or fallen off the surface of the device 502 due to poor adhesion and thermal instability. As shown in FIG. 5, the multilayer encapsulating film includes alternating layers of one or more barrier layers 511, 512, 513, etc., and one or more low-dielectric constant material layers 521, 522, etc.

In one aspect, the invention provides the one or more low-dielectric constant material layers 521, 522 deposited in between the one or more barrier layers 511, 512, 513. In another aspect, the final layer of the multilayer encapsulating film deposited on top of a substrate surface is a barrier layer, such as the barrier layer 513. The final layer includes a barrier material, such as silicon nitride, silicon oxynitride, silicon oxide, and silicon carbide, among others, deposited using method of the invention to serve as a good water and oxygen barrier for the final surface of the exemplary display device 500.

The first layer on top of the device 502 can be a low-dielectric constant material layer or a barrier layer. In a preferred embodiment, the invention provides a first layer deposited on top of the device 502 being a barrier layer to enhance water-barrier performance for the exemplary display device 500. For example, a first barrier layer, such as the barrier layer 511, can be deposited before a adhesion enhancing layer and/or a low-dielectric constant material layer, such as the low-dielectric constant material layer 521. Accordingly, the low-dielectric constant material layers are deposited on top of the barrier layers to promote adhesion between adjacent barrier layers such that the multilayer encapsulating film can be deposited into sufficient thickness, such as about 8,000 Å or larger.

Figure 6:
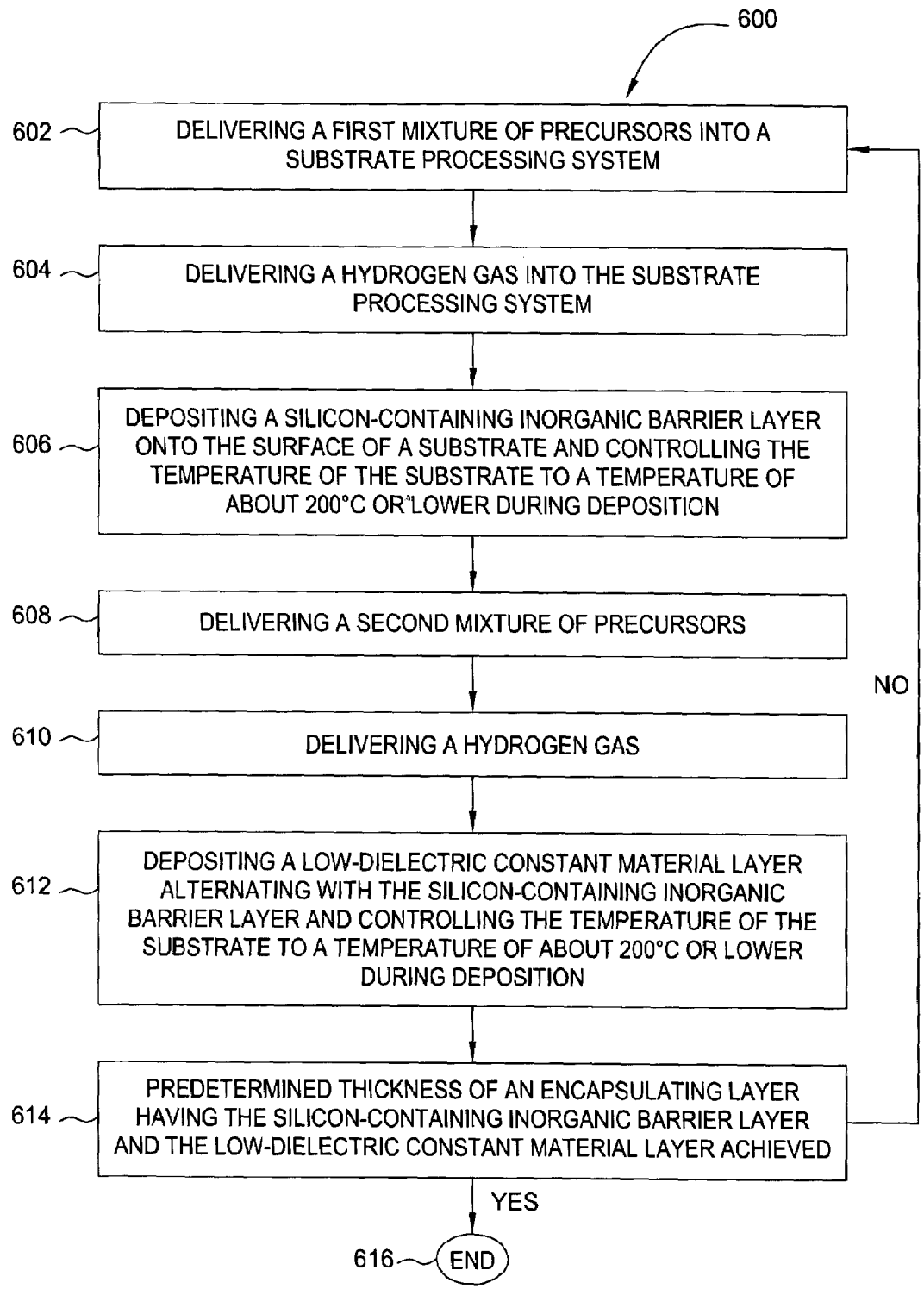
FIG. 6 is a flow chart of one method of forming a multilayer encapsulating film on a substrate inside a substrate processing system in accordance with embodiments of the invention.

FIG. 6 illustrates a flow chart of a deposition method 600 in accordance with one embodiment of the invention. First of all, a substrate is placed in a process chamber of a substrate processing system for depositing a material layer, such as an encapsulating layer 305, on the substrate. The method 600 optionally includes a step of forming a device on the substrate. Exemplary devices include, but is not limited to, OLED, PLED, and FOLED, among others.

At step 602, a first mixture of precursors for a barrier layer, such as a silicon-containing barrier layer, is delivered into the substrate processing system. The first mixture of precursors may include one or more silicon-containing gases, such as silane ($SiH_4$), $SiF_4$, and $Si_2H_6$, among others. The first mixture of precursors may further include one or more nitrogen-containing gases, such as ammonia ($NH_3$), nitrous oxide ($N_2O$), nitric oxide (NO), and nitrogen gas ($N_2$), among others. The first mixture of precursors may also include a carbon-containing gas and/or an oxygen-containing gas.

For example, a silicon nitride barrier layer can be deposited from a mixture of a silicon-containing gas and a nitrogen-containing gas, such as a mixture of silane, ammonia, and/or nitrogen gas. As another example, a silicon oxynitride barrier layer can be deposited from a mixture of a silicon-containing gas, an oxygen-containing gas, and a nitrogen-containing gas, such as a mixture of silane, nitrous oxide, and/or nitrogen gas.

At step 604, a hydrogen gas is delivered into the substrate processing system and a silicon-containing inorganic barrier layer is deposited onto the surface of a substrate at a substrate temperature of about 200° C. or lower at step 606. The substrate temperature during substrate processing for a display device, such as an OLED device 300, needs to be kept at low temperature due to thermal instability of organic layers in the OLED device, such as the multiple layers of organic materials 303. In generally, a temperature of about 150° C. or lower is desired, such as about 100° C. or lower, about 80° C. or lower, or between about 20° C. and about 80° C.

It is found that the presence of a hydrogen gas reduces the surface roughness of the deposited silicon-containing inorganic barrier layer, resulting in a surface roughness measurement (RMS) of from about 40 Å to about 70 Å being reduced to about 40 Å or lower, such as about 15 Å or lower, preferably about 10 Å or lower. We have also found that a barrier layer with reduced surface roughness (a smooth surface) significantly prevents water penetration into the barrier layer, making it a good encapsulating layer for any materials underneath (e.g., organic and/or polymer materials used for display devices). The introduction of hydrogen gas prevents water penetration with a water vapor transmission rate of less than about $1 \times 10^{-2}$ grams per square meter per day, such as between about $1 \times 10^{-3}$ grams per square meter per day to about $1 \times 10^{-4}$ grams per square meter per day as measured at about 38° C. with 90% relative humidity.

At step 608, a second mixture of precursors for a low-dielectric constant material layer is delivered into the same or a different substrate processing system. Preferably, the low-dielectric constant material layer is processed in the same substrate processing system as the barrier layer deposition system for increasing the throughput of substrate processing. In addition, the substrate can be placed in the same or different process chamber of a substrate processing system for depositing the barrier layer and/or the low-dielectric constant material for ease of operation and reducing the chance of air and moisture exposure when taking the substrate in and out of a substrate processing system.

The second mixture of precursors may include one or more carbon-containing compounds, such as acetylene ($C_2H_2$), ethane ($C_2H_6$), ethene ($C_2H_4$), methane ($CH_4$), propylene ($C_3H_6$), propyne ($C_3H_4$), propane ($C_3H_8$), butane ($C_4H_{10}$) butylene ($C_4H_8$), butadiene ($C_4H_6$), benzene ($C_6H_6$), and toluene ($C_7H_8$), among others.

The low-dielectric constant material layer may be an amorphous carbon material, a diamond-like-carbon material, and carbon-doped silicon containing material, among others. For example, an amorphous carbon layer can be deposited from a mixture of a carbon-containing compound, such as acetylene ($C_2H_2$).

At step 610, a hydrogen gas is delivered into the substrate processing system and a low-dielectric constant material layer is deposited onto the surface of a substrate at a substrate temperature of about 200° C. or lower at step 612. Preferably, a substrate temperature of about 150° C. or lower, such as about 100° C. or lower, about 80° C. or lower, or between about 20° C. and about 80° C., is used.

It is found that the presence of a hydrogen gas improves film uniformity of the deposited low-dielectric constant material layer, resulting in a film uniformity measurement of from between about +/−15% to about +/−35% being improved to about +/−10% or lower, such as about +/−5% or lower or about +/−3% or lower. We have also found that a low-dielectric constant material layer with improved film uniformity significantly improves the step coverage of the deposited low-dielectric constant material layer, such that additional multilayer can be deposited with good step coverage. For example, a step coverage of about 80% or higher, e.g., about 95% or higher, for layers of the encapsulating film is observed.

At step 614, if a predetermined thickness of an encapsulating film having the silicon-containing inorganic barrier layer and the low-dielectric constant material layer is obtained, the deposition process can be ended at step 616. However, if a predetermined thickness of the encapsulating layer is not obtained, then any of the combinations of steps 602, 604, 606, 608, 610, 612 can be repeated. For example, once a desired thickness is obtained after one or more silicon-containing inorganic barrier layer and one or more low-dielectric constant material layers are deposited, the method 600 may end where a silicon-containing inorganic barrier layer or a low-dielectric constant material layers is last deposited.

The thickness of the encapsulating layer can vary. For example, a thickness of about 1,000 Å or larger, e.g., about 10,000 Å or larger, such as between about 20,000 Å to about 60,000 Å, may be desired. We have found out that the thickness of an encapsulating film for the device 502 is correlated to its air and moisture barrier performance, thus lengthening the lifetime of the device 502. Using methods of the invention, a lifetime of about 40 days or longer for the device 502, such as about 45 days or longer, or about 60 days or longer can be obtained.

In one aspect, a single barrier layer deposited using methods of the invention can be used as an encapsulating film for a display device of the invention. For example, a single silicon nitride barrier layer having a thickness of about 10,000 Å can be used as an encapsulating film. In another aspect, the invention provides a multilayer encapsulating film having at least one silicon-containing inorganic barrier layer and at least one low-dielectric constant material layer. The silicon-containing inorganic barrier layer may have a thickness of between about 1,000 Å to about 10,000 Å, such as between about 2,000 Å to about 8,000 Å. The low-dielectric constant material layer may have a thickness of between about 1,000 Å to about 10,000 Å. It is found that the presence of a low-dielectric constant material increase adhesion between adjacent barrier layers with improved thermal stability, making multilayer of silicon-containing inorganic barrier layer at a sufficient thickness possible.

One exemplary encapsulating film of the invention may include two silicon nitride layers and an amorphous carbon material layer in between the silicon nitride layer for a total thickness of about between about 3,000 Å to about 30,000 Å. Another exemplary encapsulating film of the invention may include five silicon nitride layers and four amorphous carbon material layers in between the five silicon nitride layers for a total thickness from about 9,000 Å to about 90,000 Å.

The surface of the substrate may be cleaned with a plasma before or after each layer is deposited. For example, one or more cleaning gases can be supplied to the process chamber and an electric field from an RF power source or microwave power source can be applied to generate a cleaning plasma. The cleaning gases may include, but are not limited to, oxygen-containing gas (e.g., oxygen, carbon dioxide), hydrogen-containing gas (e.g., hydrogen gas), nitrogen-containing gas (e.g., ammonia, nitrous oxide), inert gas (e.g., helium, argon), among others. Examples of hydrogen-containing gas include, but are not limited to, hydrogen gas ($H_2$) and ammonia ($NH_3$), among others. In addition, when the chamber is cleaned by a plasma generated from a cleaning gas, the cleaning gas may optionally be delivered with a carrier gas and supplied into the chamber. Exemplary carrier gas includes inert gases, such as helium and argon, among others. For example, an in-situ oxygen plasma may be generated to clean away any material inside the process chamber, such as materials on the chamber walls, gas distribution plate, everywhere, after previous substrate processing and substrate removal.

It is noted that embodiments of the invention do not require the steps to be performed in the order as described herein. For example, a hydrogen gas can be delivered into the process chamber before a mixture of the precursors is delivered into the chamber, and in some cases, steps 602 and 604 can be performed at the same time. Similarly, steps 608 and 610 can be performed at the same time.

Deposition of at Least One Silicon-Containing Barrier Layer

One or more silicon-containing inorganic barrier layers are deposited from a mixture of precursors delivered into the process chamber. The precursors may include a silicon-containing precursor, such as silane ($SiH_4$), $Si_2H_6$, $SiF_4$, among others, for depositing a layer of silicon nitride (SiN), silicon oxynitride (SiON) or silicon oxide (SiO), silicon carbide (SiC), among others, as an encapsulating layer onto the substrate. The silicon-containing precursor can be delivered, for example, at a flow rate of 10 sccm or larger, such as from about 100 sccm to about 500 sccm for a substrate size of about 400 mm×about 500 mm. A nitrogen-containing precursor can be delivered at a flow rate of about 5 sccm or larger, such as from about 100 sccm to about 6000 sccm for various nitrogen-containing precursors.

For example, a mixture of the precursors may include silane, nitrous oxide, and nitrogen, among others, for depositing a silicon oxynitride film. Alternatively, silane, ammonia, and nitrogen, among others are used for depositing a silicon nitride film. Also, the precursors may include silane, and nitrous oxide for depositing a silicon oxide film. In addition, each precursor can be delivered at different or the same flow rate, depending on various deposition parameters required. It is understood that embodiments of the invention include scaling up or scaling down any of the process parameter/variables as described herein according to substrate sizes, chamber conditions, etc., among others.

During deposition of the one or more silicon-containing inorganic barrier layers, a hydrogen gas is delivered into the process chamber to improve water-barrier performance of the encapsulating layer of the invention. In addition, the introduction of the hydrogen gas is found to reduce surface roughness of the one or more silicon-containing inorganic barrier layers, making it a good encapsulating layer.

The one or more silicon-containing inorganic barrier layers are deposited onto the substrate by applying an electric field and generating a plasma inside the process chamber. The electric field can be generated by applying a power source, such as radio-frequency power, microwave frequency power, to the process chamber. The power source can be coupled to the process chamber inductively or capacitively. In addition, the pressure of the process chamber is maintained at about 0.5 Torr to about 10 Torr.

As a result, the one or more silicon-containing inorganic barrier layers are deposited at a deposition rate of about 500 Å/min or larger, such as between about 1000 Å/min to about 3000 Å/min. The thickness of the one or more silicon-containing inorganic barrier layers may be varied to a range of from about 1,000 Å to about 30,000 Å. Usually a thicker barrier layer is better than a thinner barrier layer for preventing water penetration.

Conventional low temperature inorganic film deposition processes have produced undesired properties in an encapsulating layer. For example, the film is less dense and the surface of the film is rough with defect structure and poor film property, such as high refractive index change after water test, high transmission fourier transform infrared spectra (FTIR) change, high water vapor transmission rate (WVTR) after water test. As an example, deposition of a silicon nitride thin film with good water-barrier performance to be used as a good moisture barrier/film will be further illustrated herein below, but the invention is not meant to be limited to the details described herein.

Substrates (400 mm×500 mm in size) were brought under vacuum inside a chamber of a conventional parallel-plate radio-frequency (RF) plasma enhanced chemical vapor deposition (PECVD) system, AKT 1600 PECVD, available from Applied Materials, Inc., Santa Clara, Calif. with a spacing of about 900 mils. The temperature of the substrate support (susceptor) was set at about 60° C. for a low temperature deposition process. Mixtures of silane (SiH$_4$), ammonia (NH$_3$), nitrogen (N$_2$) in the presence of hydrogen gas (H$_2$) were delivered into the chamber as the source precursor gases for depositing a silicon nitride film as moisture and oxygen barrier. As a comparison, prior art methods of using silane (SiH$_4$), ammonia (NH$_3$), and a nitrogen (N$_2$) for depositing silicon nitride was prepared in parallel under the same process conditions. The pressure inside the chamber is about 2.1 Torr. A plasma was sustained with RF power generator set at about 13.56 MHz and about 900 W.

Basic film properties were compared for films prepared from both process conditions. The results showed that silicon nitride films deposited in the presence and absence of hydrogen source gas exhibit similar basic film properties initially with refractive index (RI) of about 1.7 to about 1.9 and film stress of zero to about 2×10$^9$ dynes/cm$^2$. The deposition rate is comparable for both films at about 1000 Å/min to about 1500 Å/min. Thus, the presence of hydrogen gas does not affect basic film properties or the deposition rate.

However, surface roughness after deposition (in the unit of root mean square, RMS) for both films varied dramatically. Both films were compared under microscope, and 3-dimensional surface roughness images were compared and surface roughness was measured. The average surface roughness for SiN film deposited without hydrogen source gas was about 40 Å to about 70 Å, indicating a rough surface. The average surface roughness for SiN film deposited in the presence of hydrogen source gas was about 9 Å to about 12 Å, indicating a smooth surface.

The comparison was more significant when both films were compared after water test to measure the effect of water/moisture on film property. According to Table 1 for a comparison of key water-barrier performance, it is found that H$_2$ source gas plays an important role to reduce film surface roughness into a smooth surface, and a smooth surface prevents water/oxygen penetration from atmosphere into the film inside, resulting in much lower WVTR (Water Vapor Transmission Rate) value, a key parameter in the flat panel display industry to indicate resistance to moisture/water. Water test to measure WVTR is a high-humidity test usually carried out by placing a test structure in a humidity chamber operating at a temperature range of about 25° C. to about 100° C. and about 40% to about 100% relative humidity (RH) for a specified amount of time (in hours or days, etc.). The amount of water retained on the specific size of the tested structure per test time was calculated to give a Water Vapor Transmission Rate (WVTR) at the tested temperature and tested relative humidity.

TABLE 1

Comparison of key water-barrier performance

|  | SiN film without H2 | SiN film with H2 |
| --- | --- | --- |
| Surface roughness after deposition (RMS) | about 40 Å to about 70 Å | about 9 Å to about 12 Å |
| Refractive Index (RI) change after water treatment (100° C./100 hours) | 15% | 0% |
| FTIR change after water treatment (100° C./100 hours) | O—H bond increased, Si—H bond reduced, N—H bond reduced | No change |
| Water Vapor Transmission Rate (WVTR) at 38° C./90% relative humidity | More than about 1.0 × 10$^{-2}$ g/m$^2$day | About 1.0 × 10$^{-4}$ g/m$^2$day to about 1.0 × 10$^{-3}$ g/m$^2$day |

The transmission fourier transform infrared spectra (FTIR) before and after water treatment for the SiN film deposited with hydrogen source gas were also performed and compared. Water treatment for comparison of change in FTIR and refractive index (RI) were also performed by soaking different deposited films in hot water, such as about 100° C., for a specified amount of time, e.g., about 100 hours. The FTIR spectra were recorded in the range of 1500 cm$^{-1}$ to 4000 cm$^{-1}$. The Si—H, N—H, and O—H bonds were indicated in the spectra. There is not much difference before and after water treatment, indicating no change of any bonds after water treatment from the SiN film deposited with a hydrogen source gas. The results, as shown in Table 1, also indicated that, after treatment of the SiN film in water at about 100° C. for about 100 hours (hot and humid), there is no change of refractive index for the SiN film deposited under the deposition conditions in the presence of hydrogen gas as one of the precursor source gases. Together with the results of low water vapor transmission rate (WVTR) measured after water test, all of which are indicative that a high quality silicon nitride was deposited with good water-barrier performance using a hydrogen gas as part of source gas mixtures.

As a comparison, the transmission fourier transform infrared spectra (FTIR) change before and after water treatment for the SiN films deposited using the prior art method without hydrogen source gas were also performed and compared. The results demonstrated a big decrease in Si—H bond, a small decrease in N—H bond, and a small peak increase in 0—H bond. The results, also shown in Table 1, indicated that, there is about 15% change of refractive index for the SiN film deposited without a hydrogen source gas. In addition, higher water vapor transmission rate (VVVTR) was measured after water test. All of which are indicative that the silicon nitride film deposited in the absence of hydrogen source gas exhibits poor water-barrier performance.

Deposition of at Least One Low-Dielectric Constant Material Layer

Aspects of the invention provide alternatively depositing a low-dielectric constant material layer and a silicon-containing inorganic barrier layer. One exemplary low-dielectric constant material layer having a dielectric constant (κ) of less than about 4 is an amorphous carbon material. Other examples of low-dielectric constant materials include carbon-containing low-dielectric constant materials, carbon-doped silicon material, diamond-like carbon material, among others.

Figure 7:
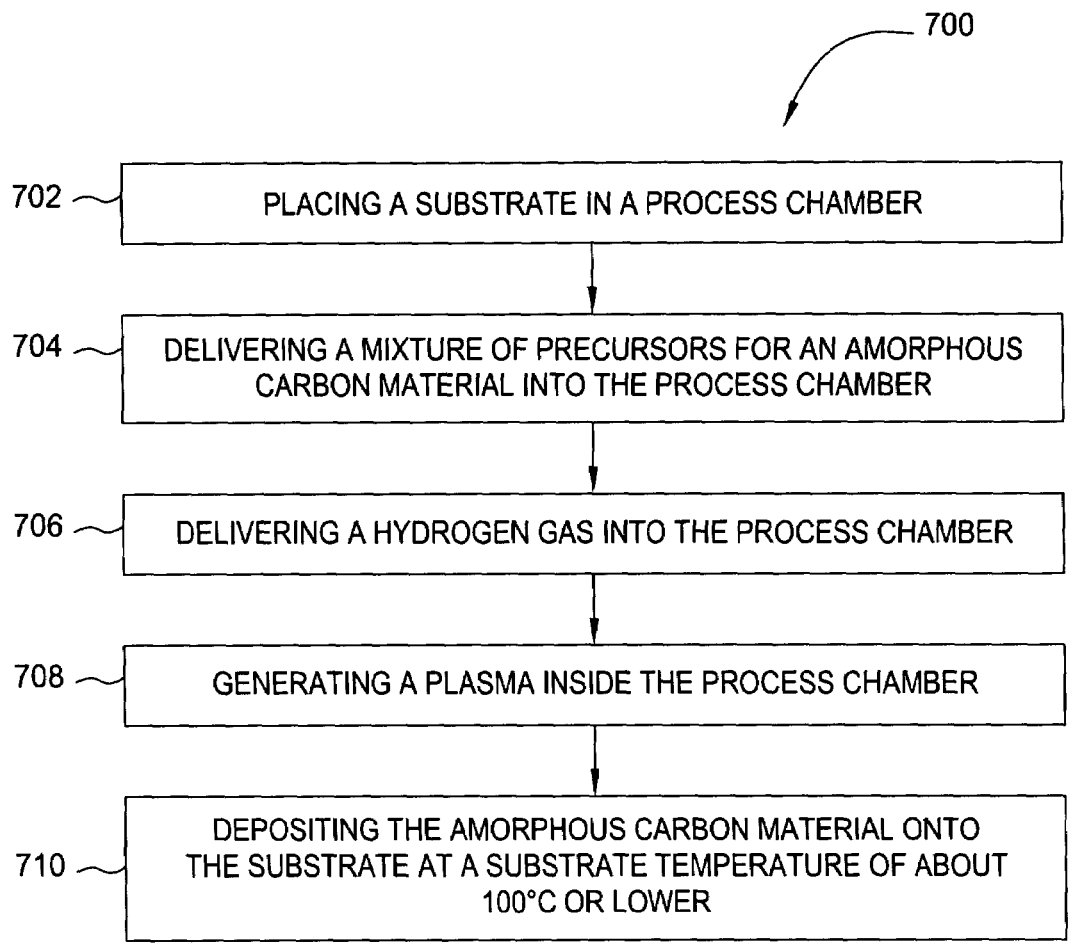
FIG. 7 is a flow chart of one method of depositing a low-dielectric constant material on a substrate inside a process chamber in accordance with embodiments of the invention.

FIG. 7 illustrates a flow chart of a deposition method 700 in accordance with one embodiment of the invention. At step 702, a substrate is placed in a deposition process chamber for depositing a low-dielectric constant material, such as an amorphous carbon material layer on the substrate.

At step 704, a mixture of precursors for the amorphous carbon material is delivered into the process chamber. A wide variety of gas mixtures may be used to deposit the low-dielectric constant material, and non-limiting examples of such gas mixtures are provided below. Generally, the gas mixture may include one or more carbon-containing compounds and/or hydrocarbon compounds. Suitable organic carbon-containing compounds include aliphatic organic compounds, cyclic organic compounds, or combinations thereof. Aliphatic organic compounds have linear or branched structures comprising one or more carbon atoms. Organic carbon-containing compounds contain carbon atoms in organic groups. Organic groups may include alkyl, alkenyl, alkynyl, cyclohexenyl, and aryl groups in addition to functional derivatives thereof. The carbon-containing precursor/compound can be delivered, for example, at a flow rate of 10 sccm or larger, such as from about 100 sccm to about 500 sccm for a substrate size of about 400 mm×about 500 mm.

For example, the carbon-containing compound can have a formula $C_xH_y$, where x has a range of between 1 and 8 and y has a range of between 2 and 18, including, but not limited to, acetylene ($C_2H_2$), ethane ($C_2H_6$), ethene ($C_2H_4$), propylene ($C_3H_6$), propyne ($C_3H_4$), propane ($C_3H_8$), methane ($CH_4$), butane ($C_4H_{10}$), butylene ($C_4H_8$), butadiene ($C_4H_6$), benzene ($C_6H_6$), toluene ($C_7H_8$), and combinations thereof. Alternatively, partially or completely fluorinated derivatives of the carbon-containing compounds, for example, $C_3F_8$ or $C_4F_8$, may be used to deposit a fluorinated amorphous carbon layer, which may be described as an amorphous fluorocarbon layer. A combination of hydrocarbon compounds and fluorinated derivatives of hydrocarbon compounds may be used to deposit the amorphous carbon layer or amorphous fluorocarbon layer.

A variety of gases may be added to the gas mixture to modify properties of the amorphous carbon material. An inert gas (e.g., helium, argon, neon, xenon, krypton, etc.), nitrogen ($N_2$), ammonia ($NH_3$), nitrous oxide ($N_2O$), nitric oxide (NO), or combinations thereof, among others, delivered at a flow rate of about 5 sccm or larger, such as between about 100 sccm to about 6000 sccm, are used to control the density and deposition rate of the low-dielectric constant amorphous carbon layer. Further, the addition of $H_2$ and/or $NH_3$ can be used to control the hydrogen ratio of the amorphous carbon layer to control layer properties, such as reflectivity.

At step 706, a hydrogen gas is delivered into the process chamber to enhance film uniformity (decrease in % uniformity measurement). When the hydrogen gas is added as a source gas, a film uniformity of about +/−10% or lower, such as about +/−5% or lower or about +/−3% or lower, is obtained. In contrast, without adding the hydrogen gas, the deposited low-dielectric constant amorphous carbon material is very rough and non-uniform with a film uniformity measurement of between about +/−15% to about +/−35%. Without the hydrogen gas to improve film uniformity, there is a much more drastic impact on step coverage when multiple layers are deposited. A low-dielectric constant amorphous carbon material layer with enhanced film uniformity (a smooth and uniform film surface) significantly improves step coverage to about 80% or higher, or even about 95% or higher, and also adheres well in between silicon-containing inorganic barrier layers in a multilayer film stack.

At step 708, an electric field is applied and a plasma is generated inside the process chamber. The electric field can be generated by applying a power source, such as radio-frequency power, microwave frequency power, to the process chamber. The power source can be coupled to the process chamber inductively or capacitively. Power from a single 13.56 MHz RF power source may be supplied to the process chamber to form the plasma at a power density between about 0.14 watts/cm$^2$ and about 8.6 Watts/cm$^2$, or a power level between about 100 watts and about 6000 watts. A power density between about 0.25 watts/cm$^2$ and about 0.6 watts/cm$^2$ is preferably supplied to the process chamber to generate the plasma. The RF power may be provided at a frequency between about 0.01 MHz and 300 MHz. The RF power may be provided continuously or in short duration cycles. RF power is coupled to the process chamber to increase dissociation of the compounds. The compounds may also be dissociated in a microwave chamber prior to entering the deposition chamber. However, it should be noted that the respective parameters may be modified to perform the plasma processes in various chambers and for different substrate sizes.

The carbon-containing compound and the hydrogen gas are introduced to the process chamber from a carbon-containing compound supply source and a hydrogen gas supply source through a gas distribution system and into the process chamber. The gas distribution system is generally spaced between about 180 mils and about 2000 mils, such as about 900 mils, from the substrate on which the low-dielectric constant amorphous carbon layer is being deposited upon. In addition, the pressure of the process chamber is maintained at about 100 milliTorr to about 20 Torr.

At step 710, the amorphous carbon material is deposited onto the substrate by applying the amorphous carbon layer at a substrate temperature of about 100° C. or lower, such as a substrate temperature maintained at between about −20° C. and about 100° C., and preferably maintained at a temperature between about 20° C. and about 80° C. A preferred amorphous carbon layer is deposited, in one embodiment, by supplying acetylene to a plasma process chamber at a flow rate between about 100 standard cubic centimeters per minute (sccm) and about 5,000 sccm, such as about 200 sccm. A hydrogen gas is also added to the process chamber at a flow rate between about 100 sccm and about 2,500 sccm, such as between about 200 sccm and about 600 sccm.

The above process parameters provide a typical deposition rate for the low-dielectric constant amorphous carbon layer in the range of about 500 Å/min or more, such as between about 1,500 Å/min to about 2,500 Å/min, and can be implemented on the same or different chemical vapor deposition chamber in a conventional parallel-plate radio-frequency (RF) plasma enhanced chemical vapor deposition (PECVD) system, available from Applied Materials, Inc., Santa Clara, Calif., as the system for depositing the silicon-containing inorganic barrier layer for convenience. The amorphous carbon deposition values provided herein are illustrative and should not be construed as limiting the scope of the invention.

The deposited low-dielectric constant amorphous carbon material includes carbon and hydrogen atoms, which may be an adjustable carbon:hydrogen ratio that ranges from about 10% hydrogen to about 60% hydrogen. Controlling the hydrogen ratio of the amorphous carbon layer is desirable for tuning its respective optical properties, etch selectivity, and chemical mechanical polishing resistance properties. Specifically, as the hydrogen content decreases, the optical properties of the as-deposited layer, for example, the index of refraction (n) and the absorption coefficient (k), increase. Similarly, as the hydrogen content decreases, the etch resistance of the amorphous carbon layer increases. It is understood that embodiments of the invention include scaling up or scaling down any of the process parameter/variables as described herein according to substrate sizes, chamber conditions, etc., among others. It is also noted that embodiments of the invention do not require the steps to be performed in the order as described herein. For example, a hydrogen gas can be delivered into the process chamber before a mixture of the precursors is delivered into the chamber, and in some cases, steps 704 and 706 can be performed at the same time. Optionally, a nitrogen-containing gas, such as a nitrogen gas, is supplied into a gas mixture at a flow rate between about 200 sccm and about 5,000 sccm, such as between about 1,000 sccm and about 2,000 sccm.

EXAMPLES

Figure 8:
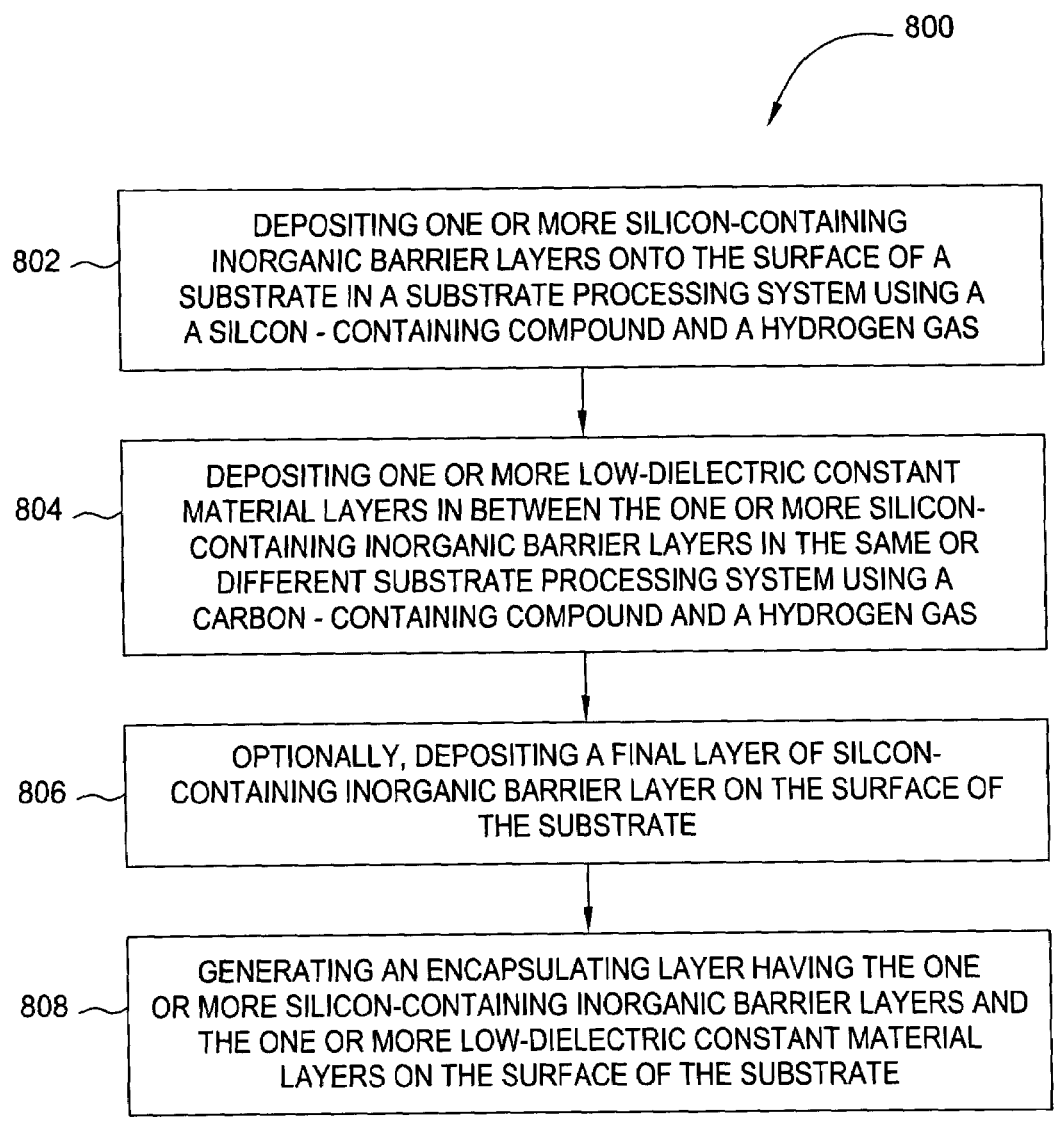
FIG. 8 is a flow chart of another method of forming a multilayer encapsulating film on a substrate inside a substrate processing system in accordance with embodiments of the invention

FIG. 8 illustrates a flow chart of one exemplary deposition method 800 in accordance with one embodiment of the invention. At step 802, one or more silicon-containing inorganic barrier layers are deposited onto the surface of a substrate in a substrate processing system using a silicon-containing compound and a hydrogen gas. At step 804, one or more amorphous carbon layers are deposited in between the one or more silicon-containing inorganic barrier layers in the same or different substrate processing system using a carbon-containing compound and a hydrogen gas. Preferably, an initial layer of a silicon-containing inorganic barrier material, such as a silicon nitride layer is deposited first to provide as a good water and oxygen barrier for any layers underneath the silicon nitride layer and on the substrate.

Figure 9:
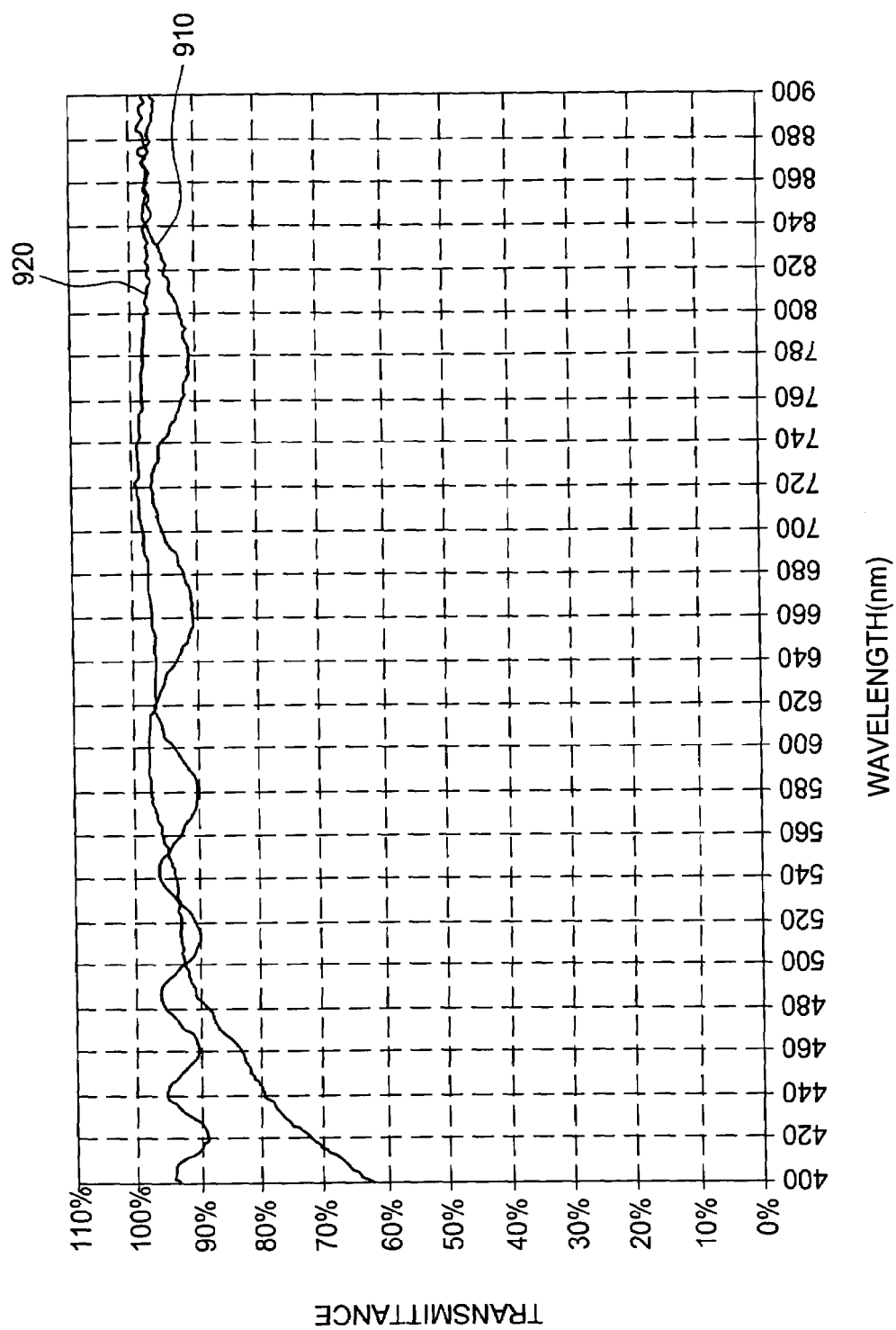
FIG. 9 illustrates optical properties of one exemplary barrier layer and exemplary low-dielectric constant material layer deposited by the method of the invention.

FIG. 9 shows the optical transmittance of one exemplary barrier layer and exemplary low-dielectric constant material layer. The exemplary barrier layer is a silicon nitride layer deposited by a mixture of silane, ammonia, nitrogen gas, and hydrogen gas, delivered at about 150 sccm, about 400 sccm, about 1,500 sccm, and about 4,000 sccm, respectively, into a PECVD process chamber. The substrate was placed into the PECVD process chamber at a spacing of about 900 mils and a pressure of about 2.1 Torr was maintained. A plasma was applied from a RF power density of about 0.45 watts/cm$^2$ for a deposition time period of about 390 seconds in the presence of a substrate bias. A substrate temperature of about 70° C. is maintained during deposition, resulting in a deposition rate of about 1,700/min.

The exemplary low-dielectric constant material layer is an amorphous carbon layer deposited by a mixture of acetylene, nitrogen gas, and hydrogen gas, delivered at about 200 sccm, about 1,000 sccm, and about 500 sccm, respectively, into the same PECVD process chamber. The substrate was placed into the PECVD process chamber at a spacing of about 900 mils and a pressure of about 1.5 Torr was maintained. A plasma was applied from a RF power density of about 0.25 watts/cm$^2$ for a deposition time period of about 500 seconds in the presence of a substrate bias. A substrate temperature of about 70° C. is maintained during deposition, resulting in a deposition rate of about 1,200 angstroms/min.

The light transmittance measurement of the deposited silicon nitride film (910) and the deposited amorphous carbon film (920) are shown in FIG. 9. The transmittance for both films at different wavelengths is very high, on the average of between about 65% to about 100%. At high wavelengths of about 500 nm or larger, the transmittance is even better, having between about 90% to about 100% light transmittance. The results suggest that the silicon nitride and amorphous carbon films of the invention can also be used in a variety of applications, including top or bottom emissive display devices.

Referring back to FIG. 8, at step 806, a silicon-containing inorganic barrier layer is optionally deposited as the final layer. Thus, an encapsulating layer having the one or more silicon-containing inorganic barrier layers and the one or more amorphous carbon layers is deposited on the surface of the substrate at step 808. Accordingly, various encapsulating films having one layer, two layers, three layers, four layers, or five layers of a barrier material can be deposited. Similarly, various encapsulating films having one layer, two layers, three layers, four layers, or five layers of a low-dielectric constant material can be deposited.

For example, various encapsulating films having one layer, two layers, three layers, four layers, or five layers of amorphous carbon material in between two layers, three layers, four layers, five layers or six layers, respectively, of silicon nitride material were deposited and compared/tested. In addition, the silicon-containing inorganic barrier layers and the amorphous carbon layers deposited at various thickness or in the presence and absence of a hydrogen source gas were also tested.

The encapsulating films of the invention, having the silicon-containing inorganic barrier layers and the amorphous carbon layers, were tested using a scotch tape peeling test and a calcium test. The results were very good, showing no peeling of the various multilayer encapsulating films from the substrate and no or low level of water and oxygen corrosion (no or low level of transparent calcium salt formation in a calcium test). The encapsulating films of the invention were also tested on devices, such as OLED devices, for their ability to be deposited to a desired thickness without peeling off the surface of the devices and prevent water and oxygen being penetrated into the devices and lengthening the device lifetime. When tested under about 60° C. and at high humidity of about 85%, the encapsulating films of the invention can lengthen the lifetime of the devices to be more than about 1440 hours.

Figure 10:
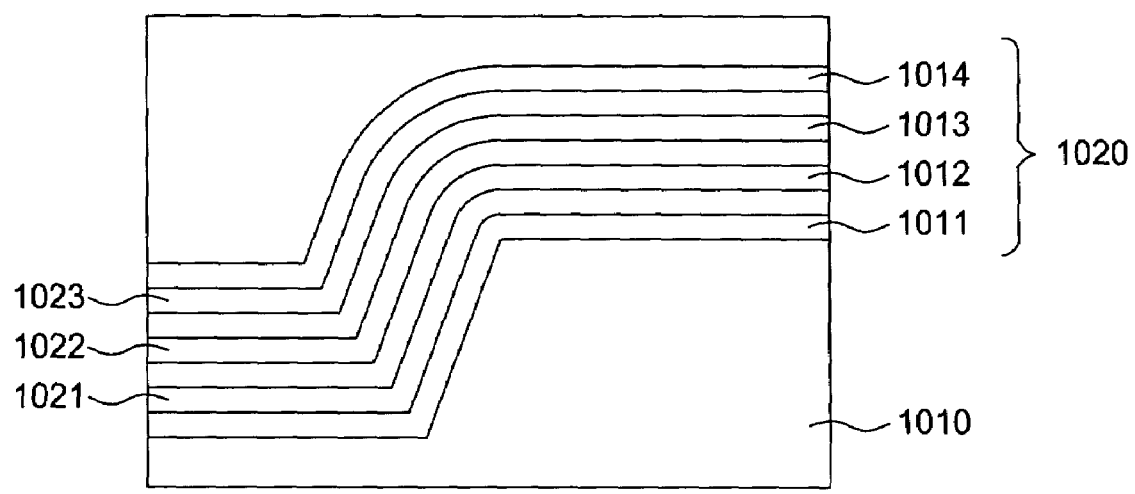
FIG. 10 illustrates one exemplary multilayer encapsulating film having four layers of silicon nitride inorganic barrier films and three layers of amorphous carbon low-dielectric constant films deposited by one method of the invention.

One exemplary multilayer encapsulating film deposited using methods of the invention is shown in FIG. 10, a cross sectional scanning electron microscopy micrograph of a substrate 1010 with a multilayer encapsulating film 1020 deposited on top. The multilayer encapsulating film 1020 of the invention include four layers of a silicon nitride barrier material 1011, 1012, 1013, 1014 and three layers of an amorphous carbon material 1021, 1022, 1023 in between the silicon nitride material to promote the adhesion of silicon nitride material, making a final thickness of the multilayer encapsulating film 1020 to be about 35,000 angstroms. The overall step coverage of the multilayer encapsulating film 1020 with a total of nine deposited material layers is very good, about 95% step coverage obtained.

While the foregoing is directed to embodiments of the present invention, other and further embodiments of the invention may be devised without departing from the basic scope thereof, and the scope thereof is determined by the claims that follow.

The invention claimed is:

1. A method for forming a multilayer encapsulating film over a substrate within a substrate processing system, comprising:
    depositing one or more silicon-containing inorganic barrier layers onto a surface of the substrate at a substrate temperature of about 200° C. or lower, comprising delivering a first mixture of precursors and a hydrogen gas into the substrate processing system; and
    depositing one or more low-dielectric constant material layers alternating with the one or more silicon-containing inorganic barrier layers, comprising delivering a second mixture of precursors into the substrate processing system.

2. The method of claim 1, wherein the thickness of the multilayer encapsulating film is about 15,000 angstroms or more.

3. The method of claim 1, the surface roughness of the multilayer encapsulating film is below about 40 angstroms or less.

4. The method of claim 1, wherein water-barrier performance of the multilayer encapsulating film is improved to include a water vapor transmission rate (WVTR) of less than about $1.0 \times 10^{-2}$ grams per square meter per day at a condition of about 38° C. and about 90% humidity.

5. The method of claim 1, wherein water-barrier performance of the multilayer encapsulating film is improved with substantially no change of refractive index (RI) after a water test at a condition of about 100° C. for about 100 hours.

6. The method of claim 1, wherein one layer of the one or more silicon-containing inorganic barrier layers is deposited as the first layer of the multilayer encapsulating film on the substrate surface.

7. The method of claim 1, wherein one layer of the one or more silicon-containing inorganic barrier layers is deposited as the last layer of the multilayer encapsulating film.

8. The method of claim 1, wherein the one or more silicon-containing inorganic barrier layers is deposited at a substrate temperature from about −20° C. to about 100° C.

9. The method of claim 1, wherein the first mixture of precursors comprises a compound selected from the group consisting of silane, $SiF_4$, $Si_2H_6$, and combinations thereof.

10. The method of claim 9, wherein the first mixture of precursors further comprises a nitrogen-containing compound selected from the group consisting of ammonia ($NH_3$), nitrous oxide ($N_2O$), nitric oxide (NO), nitrogen gas ($N_2$) and combinations thereof.

11. The method of claim 9, wherein the first mixture of precursors further comprises a compound selected from the group consisting of a carbon-containing gas, an oxygen-containing gas, and combinations thereof.

12. The method of claim 1, wherein the one or more silicon-containing inorganic barrier layers comprise a material selected from the group consisting of silicon nitride, silicon oxynitride, silicon oxide, silicon carbide, and combinations thereof.

13. The method of claim 1, wherein the one or more low-dielectric constant material layers comprise a material selected from the group consisting of amorphous carbon, diamond-like carbon, and combinations thereof.

14. The method of claim 1, wherein the second mixture of precursors comprises a compound selected from the group consisting of acetylene ($C_2H_2$), ethane ($C_2H_6$), ethene ($C_2H_4$), methane ($CH_4$), propylene ($C_3H_6$), propyne ($C_3H_4$), propane ($C_3H_8$), butane ($C_4H_{10}$), butylene ($C_4H_8$), butadiene ($C_4H_6$), benzene ($C_6H_6$), toluene ($C_7H_8$), and combinations thereof.

15. The method of claim 1, wherein a power density of the substrate processing system is maintained at between about 0.2 watts/cm$^2$ and 0.8 watts/cm$^2$ during deposition.

16. The method of claim 1, further comprising cleaning the surface of the substrate by a plasma generated from a gas selected from the group consisting of oxygen-containing gas, hydrogen-containing gas, nitrogen-containing gas, inert gas, and combinations thereof.

17. The method of claim 1, wherein the plurality of silicon-containing inorganic barrier layers and the one or more low-dielectric constant material layers are deposited in a single process chamber inside the substrate processing system.

18. The method of claim 1, wherein the multilayer encapsulating film is deposited over a device and lengthens the lifetime of the device to be more than about 1440 hours, tested under a condition of about 60° C. and at high humidity of about 85%.

19. A method for forming a multilayer encapsulating film onto a substrate placed in a substrate processing system, comprising:
    depositing a plurality of silicon-containing inorganic barrier layers onto a surface of the substrate, comprising delivering a silicon-containing compound into the substrate processing system; and
    depositing one or more low-dielectric constant material layers in between the one or more silicon-containing inorganic barrier layers at a substrate temperature of about 200° C. or lower, comprising delivering a carbon-containing compound and a hydrogen gas into the substrate processing system.

20. The method of claim 19, wherein the film uniformity of the one or more low-dielectric constant material layers is improved to about +/−10% or less.

21. The method of claim 19, wherein the one or more silicon-containing inorganic barrier layers is deposited at a substrate temperature from about −20° C. to about 100° C.

22. The method of claim 19, wherein one layer of the plurality of silicon-containing inorganic barrier layers is deposited as the first layer of the multilayer encapsulating film on the substrate surface.

23. The method of claim 19, wherein one layer of the plurality of silicon-containing inorganic barrier layers is deposited as the last layer of the multilayer encapsulating film.

24. The method of claim 19, wherein the plurality of silicon-containing inorganic barrier layers comprise a material selected from the group consisting of silicon nitride, silicon oxynitride, silicon oxide, silicon carbide, and combinations thereof.

25. The method of claim 19, wherein the one or more low-dielectric constant material layers comprise a material selected from the group consisting of amorphous carbon, diamond-like carbon, and combinations thereof.

26. The method of claim 19, wherein the carbon-containing compound comprises a compound selected from the group consisting of acetylene ($C_2H_2$), ethane ($C_2H_6$), ethene ($C_2H_4$), methane ($CH_4$), propylene ($C_3H_6$), propyne ($C_3H_4$), propane ($C_3H_8$), butane ($C_4H_{10}$), butylene ($C_4H_8$), butadiene ($C_4H_6$), benzene ($C_6H_6$), toluene ($C_7H_8$), and combinations thereof.

27. The method of claim 19, wherein the one or more silicon-containing inorganic barrier layers and the one or more low-dielectric constant material layers are deposited in a single process chamber inside the substrate processing system.

28. The method of claim 19, wherein the multilayer encapsulating film is deposited over a device and lengthens the lifetime of the device to be more than about 1440 hours, tested under a condition of about 60° C. and at high humidity of about 85%.

29. A method for depositing an encapsulating layer, having one or more layers of silicon-containing inorganic barrier materials and low-dielectric constant materials, onto a substrate in a substrate processing system, comprising:

delivering a first mixture of precursors for a silicon-containing inorganic barrier layer and delivering a hydrogen gas into the substrate processing system;

controlling the temperature of the substrate to a temperature of about 150° C. or lower and generating a plasma to deposit the silicon-containing inorganic barrier layer on a surface of the substrate;

delivering a second mixture of precursors for a low-dielectric constant material layer and delivering a hydrogen gas into the substrate processing system;

controlling the temperature of the substrate to a temperature of about 150° C. or lower and generating a plasma to deposit the low-dielectric constant material layer onto the surface of the silicon-containing inorganic barrier layer; and depositing the encapsulating layer onto the substrate by repeating the above mentioned steps until a thickness of the encapsulating layer of about 15,000 angstroms or more is obtained.

30. The method of claim 29, wherein the silicon-containing inorganic barrier layer comprises a material selected from the group consisting of silicon nitride, silicon oxynitride, silicon oxide, silicon carbide, and combinations thereof.

31. The method of claim 29, wherein the low-dielectric constant material layer comprises a material selected from the group consisting of amorphous carbon, diamond-like carbon, and combinations thereof.

32. The method of claim 29, wherein a silicon-containing inorganic barrier layers is deposited on the surface of the substrate as the last material layer of the encapsulating layer.

33. The method of claim 29, wherein the temperature of the substrate is maintained at about −20° C. to about 100° C.

34. The method of claim 29, wherein the silicon-containing inorganic barrier layers and the low-dielectric constant material layers are deposited in a single process chamber inside the substrate processing system.

35. The method of claim 29, wherein the multilayer encapsulating film is deposited over a device and lengthens the lifetime of the device to be more than about 1440 hours, tested under a condition of about 60° C. and at high humidity of about 85%.

* * * * *

UNITED STATES PATENT AND TRADEMARK OFFICE
CERTIFICATE OF CORRECTION

| | |
|---|---|
| PATENT NO. | : 7,183,197 B2 |
| APPLICATION NO. | : 11/133130 |
| DATED | : February 27, 2007 |
| INVENTOR(S) | : Won et al. |

It is certified that error appears in the above-identified patent and that said Letters Patent is hereby corrected as shown below:

Column 6, Line 1: Change "polyethyleneterephthalate (PEN)" to --polyethylenenaphthalate (PEN)--

Column 8, Line 19: Change "cm2" to --$cm^2$--

Column 10, Line 53: Change "generally" to --general--

Column 14, Line 24: Change "about70" to --about 70--

Column 14, Table 1, Line 51: Change both instances of "H2" to --$H_2$--

Column 15, Line 27: Change "0---H" to --O—H--

Column 15, Line 30: Change "(VVVTR)" to --(WVTR)--

Column 18, Line 26: Change "1,700/min" to --1,700 Å/min--

Column 22, Claim 32, Line 31: Change "layers" to --layer--

Signed and Sealed this

Twenty-second Day of May, 2007

JON W. DUDAS
*Director of the United States Patent and Trademark Office*